United States Patent
Kubota

(10) Patent No.: US 8,602,600 B2
(45) Date of Patent: Dec. 10, 2013

(54) LIGHT EMITTING DEVICE AND ELECTRONIC DEVICE

(75) Inventor: Takehiko Kubota, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 13/229,060

(22) Filed: Sep. 9, 2011

(65) Prior Publication Data

US 2012/0081892 A1    Apr. 5, 2012

(30) Foreign Application Priority Data

Oct. 4, 2010 (JP) ................. 2010-224603

(51) Int. Cl.
*F21V 9/10* (2006.01)
*F21V 7/00* (2006.01)

(52) U.S. Cl.
USPC ........... 362/296; 362/231; 362/293; 362/297; 313/113; 313/114; 313/112

(58) Field of Classification Search
None
See application file for complete search history.

(56) References Cited

U.S. PATENT DOCUMENTS

| 7,561,331 | B2 | 7/2009 | Hamagishi | |
|---|---|---|---|---|
| RE43,759 | E * | 10/2012 | Shimoda et al. | 313/506 |
| 2007/0046183 | A1* | 3/2007 | Kwok et al. | 313/504 |
| 2007/0075305 | A1* | 4/2007 | Miyata et al. | 257/13 |
| 2008/0117233 | A1 | 5/2008 | Mather et al. | |
| 2009/0103304 | A1* | 4/2009 | Kobayashi | 362/293 |

FOREIGN PATENT DOCUMENTS

| JP | A-2006-259192 | 9/2006 |
|---|---|---|
| JP | A-2008-527440 | 7/2008 |
| WO | WO 2006/080540 A1 | 8/2006 |

* cited by examiner

*Primary Examiner* — Ashok Patel
(74) *Attorney, Agent, or Firm* — Oliff & Berridge, PLC

(57) ABSTRACT

A light emitting device includes a light emitting element that includes a reflection layer formed on a substrate, a light emitting layer formed on the reflection layer, and a semi-reflection layer formed on the light emitting layer, so as to transmit a portion of light from the light emitting layer and to reflect a remaining portion of the light. The light emitting element is configured as an optical resonator that causes a portion of the light outputted from the light emitting layer travelling at a predetermined angle θ, larger than 0 degrees with respect to a direction perpendicular to the reflection layer, to resonate between the reflection layer and the semi-reflection layer and extracts the light from the side of the semi-reflection layer.

12 Claims, 3 Drawing Sheets

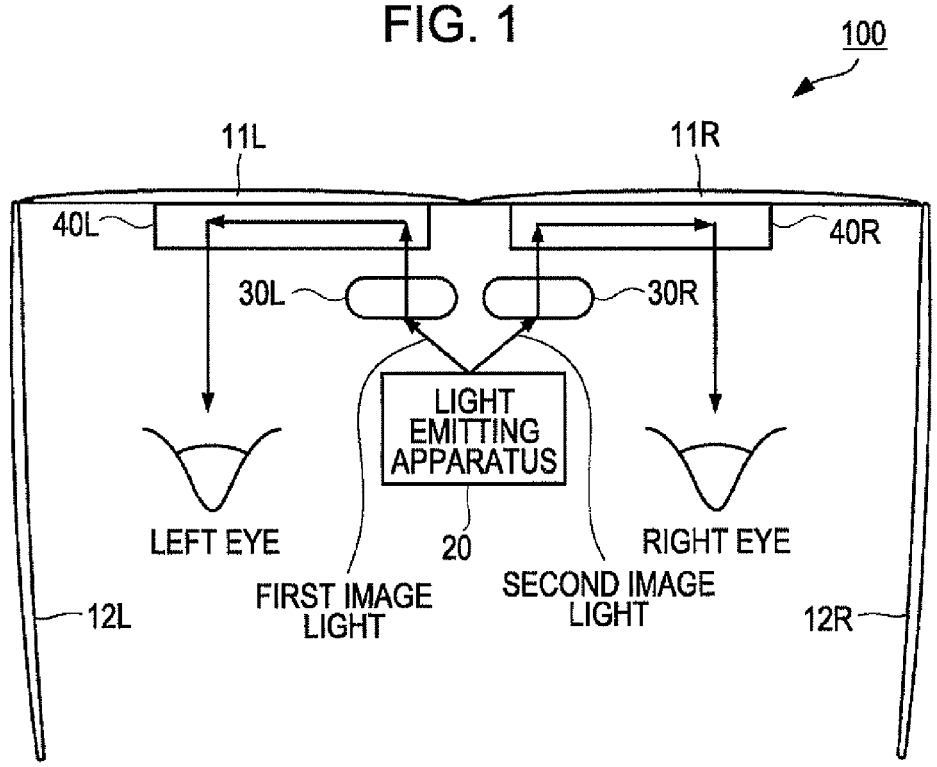
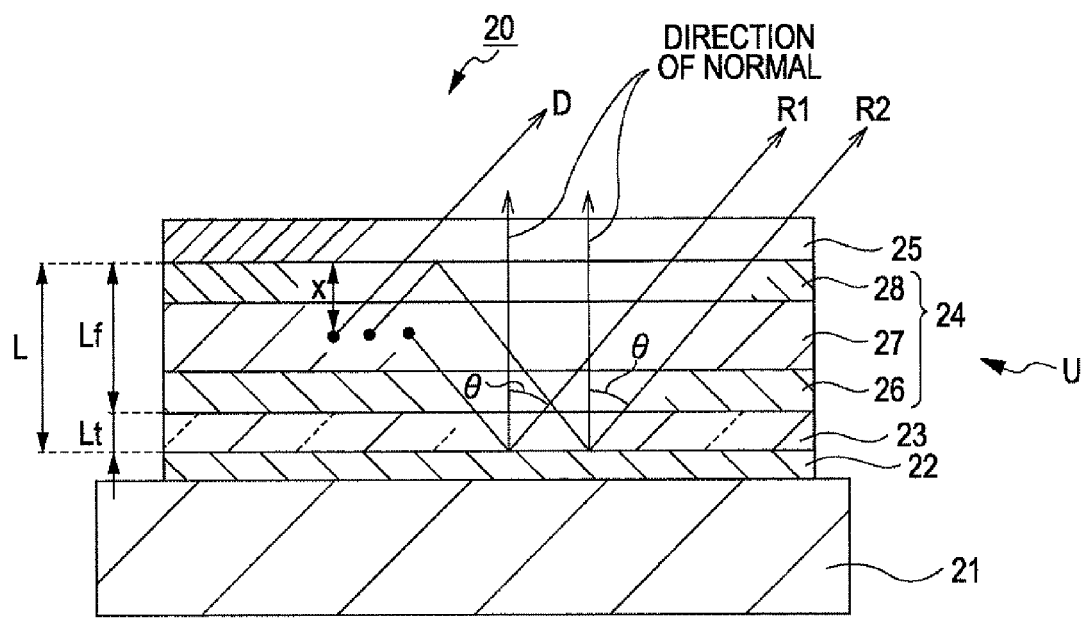

LIGHT EMITTING DEVICE AND ELECTRONIC DEVICE

BACKGROUND

1. Technical Field

The present invention relates to a light emitting device and an electronic device.

2. Related Art

In the related art, a light emitting device is known that outputs light from a light emitting element in two different directions, to thereby provide a display image to each of two different view regions, in other words to perform dual screen display. For example, JP-A-2006-259192 discloses a light emitting device that includes a lenticular lens to thereby perform the dual screen display mode. Also, for example JP-T-2008-527440 discloses a light emitting device that includes a parallax barrier to thereby perform the dual screen display.

However, the technique according to JPA-2006-259192 requires employing a lenticular lens, which leads to an increase in manufacturing cost, as well as an increase in the number of assembly steps. This also applies to the technique according to JP-T-2008-527440. Further, the technique according to JP-T-2008-527440 has an additional drawback in that light extraction efficiency is degraded, because the output light from the light emitting element is absorbed by the parallax barrier except for the portion of the output light travelling in desired directions.

SUMMARY

An advantage of some aspects of the invention is that a light emitting device is provided that can perform dual screen display with a simple structure, yet without compromising light extraction efficiency.

In an aspect, the invention provides a light emitting device including a light emitting element that includes a reflection layer formed on a substrate, a light emitting layer formed on the reflection layer, and a semi-reflection layer formed on the light emitting layer, so as to transmit a portion of light from the light emitting layer and to reflect a remaining portion of the light, wherein the light emitting element is configured as an optical resonator that causes a portion of the light outputted by the light emitting layer travelling at a predetermined angle θ, larger than 0 degrees with respect to a normal of the reflection layer, to resonate between the reflection layer and the semi-reflection layer and extracts the light from the side of the semi-reflection layer.

In the light emitting device thus configured, a portion of the light outputted by the light emitting layer travelling at a predetermined angle θ (θ>0) with respect to a direction perpendicular to the reflection layer is caused to resonate between the reflection layer and the semi-reflection layer, and extracted from the side of the semi-reflection layer. Here, the portion of the light outputted by the light emitting layer travelling at a predetermined angle θ with respect to the direction perpendicular to the reflection layer includes a light beam travelling in a direction inclined clockwise by the angle θ with respect to the direction perpendicular to the reflection layer and a light beam travelling in a direction inclined counter-clockwise by the angle θ with respect to the direction perpendicular to the reflection layer. Thus, two resonant light beams respectively travelling in different directions (other than a forward direction) are emitted from a single light emitting element, which allows dual screen display to be performed without the need to employ a lenticular lens or a parallax barrier. Therefore, a light emitting device can be provided that can perform dual screen display with a simple structure, yet without compromising light extraction efficiency.

In a specific aspect of the light emitting device, an optical distance L between the reflection layer and the semi-reflection layer may be determined in accordance with the following equation, in which λ represents a wavelength of the light emitted from the light emitting layer:

$$2L/\cos\theta = m\times\lambda \text{ (}m\text{ is a natural number)}$$

Setting the distance L so as to satisfy the above equation allows the portion of the light of the wavelength of λ emitted from the light emitting layer travelling at a predetermined angle θ with respect to the direction perpendicular to the reflection layer to resonate between the reflection layer and the semi-reflection layer, and to be extracted from the side of the semi-reflection layer.

In the case where the light travelling toward the semi-reflection layer at the angle θ is totally reflected by the semi-reflection layer, the resonant light cannot be extracted from the semi-reflection layer. Therefore, it is preferable to set the angle θ such that the light travelling toward the semi-reflection layer at the angle θ can be prevented from being totally reflected by the semi-reflection layer.

In another aspect, the light emitting device may further include a plurality of element groups provided on the substrate, each including a plurality of light emitting elements that respectively emit different colors, and a plurality of color filters each disposed so as to correspond to each of the plurality of light emitting elements on a one-to-one basis, and to receive the resonant light from the corresponding light emitting element. Disposing thus the color filters so as to receive the resonant light emitted from the corresponding light emitting element provides an advantage in that, for example, in the case where two adjacently located light emitting elements respectively emit the resonant light beams of different colors, those emitted light beams are prevented from being mixed, and from creating a mixed color.

In still another aspect, the light emitting device may further include a transparent conductive layer provided between the light emitting layer and the reflection layer so as to serve as an electrode of the light emitting element, and the semi-reflection layer may serve as the other electrode of the light emitting element. Also, the light emitting device may further include a transparent conductive layer provided between the light emitting layer and the reflection layer so as to serve as an electrode of the light emitting element, and a light-transmissive insulation layer provided between the transparent conductive layer and the reflection layer, and the semi-reflection layer may serve as the other electrode of the light emitting element.

In the case where the transparent conductive layer and the reflection layer are directly connected, the reflection layer has to be composed of such a material that keeps connection resistance between the transparent conductive layer and the reflection layer within a range that allows sufficient conductance of the transparent conductive layer to be secured. In contrast, in the case where the insulation layer is provided between the transparent conductive layer and the reflection layer, the conductance of the transparent conductive layer is not affected irrespective of which material is employed for the reflection layer, which provides an advantage of increased degree of freedom in selection of the material of the reflection layer.

Further, the foregoing light emitting device can be applied to various electronic devices. For example, the light emitting device can be suitably applied to a head-mounted display to be worn by a user for displaying images.

BRIEF DESCRIPTION OF THE DRAWINGS

The invention will be described with reference to the accompanying drawings, wherein like numbers reference like elements.

FIG. 1 is a plan view showing a general configuration of a head-mounted display according to an embodiment of the invention.

FIG. 2 is a schematic cross-sectional view of the light emitting device according to the embodiment.

DESCRIPTION OF EXEMPLARY EMBODIMENTS

1. Embodiment

Figure 3:
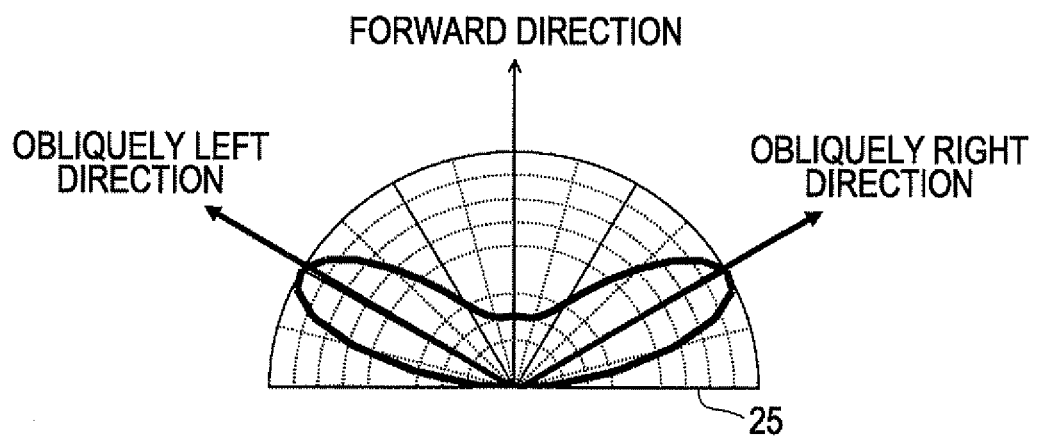
FIG. 3 is a diagram showing a characteristic of a light outputted from a light emitting element.

FIG. 1 is a plan view showing a general configuration of a head-mounted display (hereinafter abbreviated as HMD) 100 according to an embodiment of the invention. The HMD 100 is a glasses-shaped display device designed to be attached to the head of a person (user), and includes a lens 11L corresponding to the left eye, a lens 11R corresponding to the right eye, a temple portion 12L to be hooked on the left ear, a temple portion 12R to be hooked on the right ear, and a light emitting device 20 that generates a display image. The temple portion 12L is attached to a left end portion of the lens 11L, and the temple portion 12R is attached to a right end portion of the lens 11R. The HMD 100 can be attached to the head of the user upon hooking the temple portion 12L on the left ear, hooking the temple portion 12R on the right ear, and placing a nose pad (not shown) on the nose.

As will be subsequently described, the display image generated by the light emitting device 20 is obliquely emitted in left and right directions. Referring to FIG. 1, the display image emitted obliquely to the left (display image to be led to the left eye) will hereinafter be referred to as "first image light", and the display image emitted obliquely to the right (display image to be led to the right eye) will hereinafter be referred to as "second image light". In this embodiment, the first image light and the second image light represent identical images.

As shown in FIG. 1, a sub-lens 30L is located between the light emitting device 20 and the lens 11L. Also, a light guide plate 40L is located between the sub-lens 30L and the lens 11L, and the light guide plate 40L is fixed to a top portion of the lens 11L.

Likewise, a sub-lens 30R is located between the light emitting device 20 and the lens 11R. Also, a light guide plate 40R is located between the sub-lens 30R and the lens 11R, and the light guide plate 40R is fixed to a top portion of the lens 11R.

The first image light emitted from the light emitting device 20 first reaches the sub-lens 30L. The sub-lens 30L leads the first image light to the light guide plate 40L. The light guide plate 40L then leads the first image light to the left eye of the user. Likewise, the second image light emitted from the light emitting device 20 first reaches the sub-lens 30R. The sub-lens 30R leads the second image light to the light guide plate 40R. The light guide plate 40R then leads the second image light to the right eye of the user. Thus, the identical display images are displayed to the left and right eyes of the user.

FIG. 2 is a schematic cross-sectional view of the light emitting device 20. The light emitting device 20 includes a plurality of light emitting elements U arranged on a surface of a substrate 21. In this embodiment, three light emitting elements U that respectively emit light components of red (R), green (G), blue (B) constitute a pixel (group), and a plurality of such pixels are arranged on the substrate 21. For the sake of clarity of the description, FIG. 2 shows only a single light emitting element U.

Although not shown in detail, the light emitting device 20 includes a drive unit that drives each pixel on the substrate 21, and image signals are provided to the drive unit from an external device (not shown). The image signals designate a lighting color of each pixel provided on the substrate 21. More specifically, the image signals designate a gradation of each of the three primary color components (red, green, and blue) composing the lighting color of each pixel. The drive unit drives the pixels in accordance with the image signals, so that the light outputted from the respective pixels constitutes the display age.

In this embodiment, the light generated by the light emitting element U travels in a direction opposite the substrate 21 (top emission). Accordingly, non-transparent plate materials such as a ceramic or a metal can be employed as the material of the substrate 21, in addition to light-transmissive materials such as glass. Although the substrate 21 actually includes an interconnect for supplying power to the light emitting element U for emitting the light, the interconnect is not shown in the drawings. The substrate 21 also includes a circuit for supplying power to the light emitting element U, but the circuit is not shown either.

Insulative partitions (not shown) are provided on the surface of the substrate 21, so as to isolate individual light emitting elements U from each other. Although FIG. 2 only depicts a single light emitting element U, other light emitting elements U also have the same structure. As shown therein, the light emitting element U includes a reflection layer 22 formed on the substrate 21, a transparent conductive layer 23 formed on the reflection layer 22, a light emitting functional layer 24 formed on the transparent conductive layer 23, and a semi-reflection layer 25 formed on the light emitting functional layer 24. Hereunder, further details will follow.

As stated above, the reflection layer 22 is provided on the substrate 21. The reflection layer 22 is formed of a light reflecting material. Examples of suitable materials include a free metal such as Ag, and an alloy predominantly composed of Ag.

On the reflection layer 22, the transparent conductive layer 23 is provided. The transparent conductive layer 23 serves as an anode of the light emitting element U, and is formed of a transparent oxide conductive material such as indium tin oxide (ITO), indium zinc oxide (IZO, registered trademark of Idemitsu Kosan Co., Ltd.), or $ZnO_2$. In this embodiment, the transparent conductive layer 23, serving as an electrode (in this case, anode) of the light emitting element U, is formed directly on the reflection layer 22, and hence the reflection layer 22 has to be formed of such a material that keeps connection resistance between the transparent conductive layer 23 and the reflection layer 22 within a range that allows sufficient conductance of the transparent conductive layer 23 to be secured.

Referring again to FIG. 2, the light emitting functional layer 24 includes a hole transport layer 26 formed on the transparent conductive layer 23, a light emitting layer 27 formed on the hole transport layer, and an electron transport layer 28 formed on the light emitting layer 27. The light emitting layer 27 is composed of an organic EL material that emits light upon coupling of a hole and an electron. In this embodiment, the light emitting layer 27 of each light emitting element U is composed of an organic EL material that emits light of a wavelength range corresponding to one of red (R), green (G), and blue (B) colors.

As shown in FIG. 2, the semi-reflection layer 25 is provided on the electron transport layer 28. The semi-reflection layer 25 has what is known as a semi-transparent reflective nature, which transmits a portion of the light from the light emitting layer 27 and reflects the remaining portion (nature), and serves as a cathode of the light emitting element U. Examples of materials suitable for the semi-reflection layer 25 include a free metal such as Ag, and an alloy predominantly composed of Ag.

The light emitting element U according to this embodiment has an optical resonator structure that causes a portion of the light outputted by the light emitting layer 27 travelling at a predetermined angle θ, larger than 0 degrees with respect to a direction perpendicular to the reflection layer 22, to resonate (increase the emission intensity) between the reflection layer 22 and the semi-reflection layer 25 and extracts the light from the side of the semi-reflection layer 25. Specific details of such operation will be described hereunder, referring to FIG. 2.

In FIG. 2, D represents a portion of the output light from the light emitting layer 27 that travels toward the semi-reflection layer 25 at a predetermined angle θ, larger than 0 degrees with respect to the direction perpendicular to the reflection layer 22, and directly passes through the semi-reflection layer 25 without being reflected by other layers. R2 represents a portion of the output light from the light emitting layer 27 that is reflected by the semi-reflection layer 25 and then by the reflection layer 22, travels toward the semi-reflection layer 25 at the angle θ, and passes through the semi-reflection layer 25. The output light R2 travels toward the semi-reflection layer 25 and is reflected thereby, and travels toward the reflection layer 22. Then the output light R2 is again reflected by the reflection layer 22 and thus travels toward the semi-reflection layer 25, and passes therethrough. Also, R1 represents a portion of the output light from the light emitting layer 27 that is reflected by the reflection layer 22, travels toward the semi-reflection layer 25 at the angle θ, and passes through the semi-reflection layer 25. The output light R1 travels toward the reflection layer 22 and is reflected thereby. After being reflected by the reflection layer 22, the output light R1 travels toward the semi-reflection layer 25, and passes therethrough.

Conditions required for establishing the optical resonator structure will now be described, on the basis of the output light beams D, R1, and R2. In the following description, LD represents an optical distance through which the output light D reaches the semi-reflection layer 25, LR1 represents an optical distance through which the output light R1 reaches the semi-reflection layer 25, and LR2 represents an optical distance through which the output light R2 eventually reaches the semi-reflection layer 25. As shown in FIG. 2, LD can be expressed as $x/\cos \theta$, in which x represents a distance (optical distance in a direction of the normal) between the light emitting layer 27 and the semi-reflection layer 25. LR1 can be expressed as $2 \times (L-x)/\cos \theta + LD$, in which L represents a distance (optical distance in a direction of the normal) between the semi-reflection layer 25 and the reflection layer 22. This can be modified as $LR1 = (2 \times L - x)/\cos \theta$. Likewise, LR2 can be expressed as $2 \times LD + LR1$, which can be modified as $LR2 = (2 \times L + x)/\cos \theta$.

To establish the optical resonator structure, a respective difference between LD, LR1, and LR2 has to be an integer multiple of a wavelength λ of the light outputted by the light emitting layer 27. Accordingly, the following equations (1) to (3) have to be satisfied, in order to create the resonance. Here, n, n', and n" in the following equations (1) to (3) are natural numbers.

$$LR1 - LD = 2 \times (L-x)/\cos \theta = n \times \lambda \quad (1)$$

$$LR2 - LR1 = 2 \times x/\cos \theta = n' \times \lambda \quad (2)$$

$$LR2 - LD = 2 \times L/\cos \theta = n'' \times \lambda \quad (3)$$

Upon rearranging the equation (1) to (3), the following equation (4) has to be eventually satisfied, to create the resonance.

$$2 \times L/\cos \theta = m \times \lambda \quad (4)$$

m: a natural number.

In this embodiment, therefore, the distance L between the reflection layer 22 and the semi-reflection layer 25 is determined so as to satisfy the equation (4). In addition, the distance L is determined on the basis of the thickness Lf of the light emitting functional layer 24 and the thickness Lt of the transparent conductive layer 23, and in this embodiment the thickness Lt of the transparent conductive layer 23 is adjusted in each of the light emitting elements U, so as to satisfy the equation (4). Also, the angle θ is determined such that a portion of the output light from the light emitting layer 27 travelling toward the semi-reflection layer 25 at the angle θ can be prevented from being totally reflected by the semi-reflection layer 25. The foregoing configuration allows a portion of the output light from the light emitting layer 27 travelling at a predetermined angle θ to be made to resonate (to undergo an increase in emission intensity) between the reflection layer 22 and the semi-reflection layer 25, and to be extracted from the side of the semi-reflection layer 25.

Here, the portion of the output light from the light emitting layer 27 travelling at a predetermined angle θ includes a light beam travelling in a direction inclined clockwise by the angle θ with respect to the direction perpendicular to the reflection layer 22 and a light beam travelling in a direction inclined counterclockwise by the angle θ with respect to the direction perpendicular thereto. Although the foregoing passages refer solely to the portion of the output light from the light emitting layer 27 travelling in a direction inclined clockwise by the angle θ with respect to the direction perpendicular to the reflection layer 22, the portion of the output light from the light emitting layer 27 travelling in a direction inclined counterclockwise by the angle θ with respect to the direction perpendicular to the reflection layer 22 can equally be made to resonate between the reflection layer 22 and the semi-reflection layer 25 and be extracted from the side of the semi-reflection layer 25. Therefore, the light emitting device 20 according to this embodiment is configured such that two resonant light beams respectively travelling in different directions (other than a forward direction) are outputted from a single light emitting element U.

FIG. 3 is a diagram showing an emission intensity characteristic of the light outputted from the light emitting element U. The diagram indicates that portions of the light extracted from the semi-reflection layer 25 (i.e., light outwardly emitted from the light emitting element U) each travelling obliquely to the left and the right from the surface of the semi-reflection layer 25 gain a maximal emission intensity. In this embodiment, a portion of the light outwardly emitted from each of the light emitting elements U travelling obliquely to the left from the surface of the semi-reflection layer 25 constitutes the first image light mentioned earlier, and a portion of the light travelling obliquely to the right constitutes the second image light.

Thus, according to this embodiment, two resonant light beams respectively travelling in different directions are emitted from a single light emitting element U, which allows dual screen display to be performed without the need to employ a lenticular lens or a parallax barrier. The light emitting device 20 therefore provides an advantage in that dual screen display can be performed with a simple structure, yet without compromising light extraction efficiency.

Figure 4:
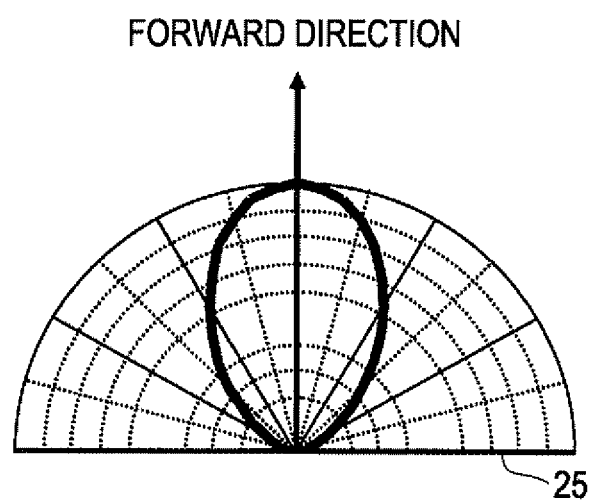
FIG. 4 is a diagram showing a characteristic of a light outputted from a light emitting element according to a comparative example.

Here, it will be assumed as a comparative example that a single light emitting element U emits resonant light straight forward from the surface of the semi-reflection layer 25. In other words, this comparative example represents the case where the angle θ is 0 degrees and the distance L between the reflection layer 22 and the semi-reflection layer 25 is set so as to satisfy the equation (4). FIG. 4 is a diagram showing an emission intensity characteristic of the light outputted from the light emitting element U according to this comparative example.

In the comparative example, the resonant light outputted from the single light emitting element U only consists of the resonant light travelling straight forward, and therefore the light emitting element that generates the display image to be led to the left eye of the user (first image light) and the emitting element that generates the display image to be led to the right eye of the user (second image light) have to be independently provided, in order to display an identical image to both left and right eyes of the user. In this embodiment, in contrast, a single light emitting element U emits two resonant light beams respectively travelling in different directions, i.e., the single light emitting element U can generate both the light to be led to the left eye and the light to be led to the right eye. Thus, this embodiment provides an advantage in that the first image light and the second image light can be generated with half the number of light emitting elements U required by the comparative example.

2. Variations

The invention is in no way limited to the foregoing embodiment and many variations may be made, some of which are described hereunder. Also, two or more of the following variations may be combined.

First Variation

Figure 5:
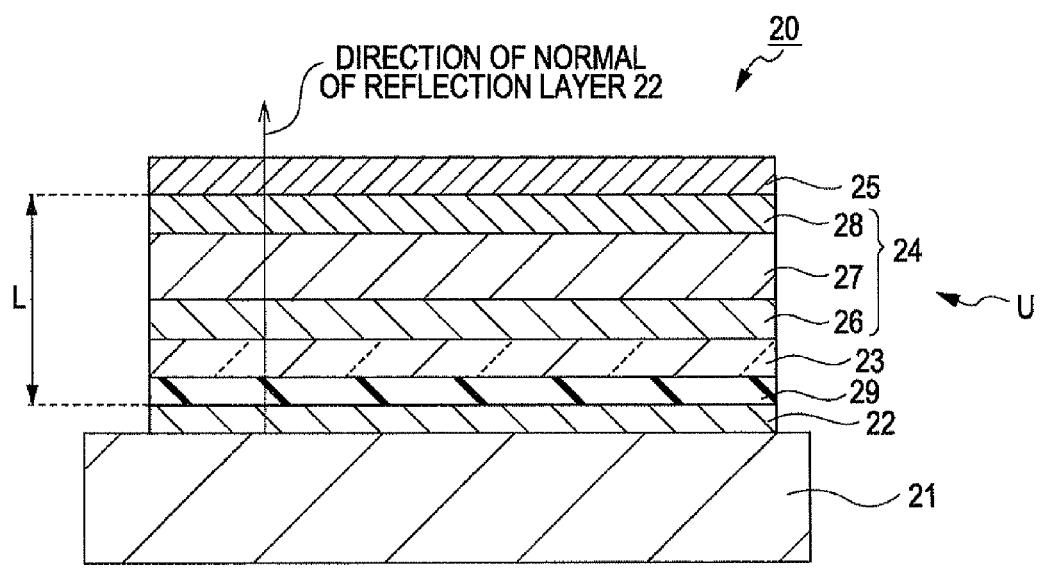
FIG. 5 is a schematic cross-sectional view of a light emitting device according to a variation of the invention.

The light emitting device 20 may be configured, for example, as shown in FIG. 5. The structure shown in FIG. 5 further includes a light-transmissive insulation layer 29 provided between the transparent conductive layer 23 and the reflection layer 22. In the foregoing embodiment, the reflection layer 22 has to be formed of such a material that keeps connection resistance between the transparent conductive layer 23 and the reflection layer 22 within a range that allows sufficient conductance of the transparent conductive layer 23 to be secured. In the structure shown in FIG. 5, however, the insulation layer 29 isolates the transparent conductive layer 23 and the reflection layer 22 from each other, the conductance of the transparent conductive layer 23 is not affected irrespective of which material is employed for the reflection layer 22. Thus, the structure shown in FIG. 5 provides an advantage of increased degree of freedom in selection of the material of the reflection layer. For example, Al cannot be employed in the foregoing embodiment, while the structure shown in FIG. 5 allows the use of Al.

Second Variation

In the foregoing embodiment, the optical resonator structure is obtained by individually adjusting the thickness Lt of the transparent conductive layer 23 of each light emitting element U. Alternatively, for example the thickness Lf of the light emitting functional layer 24 in each light emitting element U may be individually adjusted, with the thickness Lt of the transparent conductive layer 23 fixed at a predetermined value, for achieving the optical resonator structure. This variation eliminates the need to individually adjust the thickness Lt of the transparent conductive layer 23 of each light emitting element U, thereby facilitating the manufacturing of the light emitting device 20.

Third Variation

The light emitting device 20 may further include, for example, a plurality of color filters each corresponding to each of the plurality of light emitting elements U on a one-to-one basis, so as to receive the resonant light outputted from the corresponding light emitting element U. Disposing thus the color filters so as to receive the resonant light emitted from the corresponding light emitting element provides an advantage in that, for example, in the case where two adjacently located light emitting elements respectively emit the resonant light beams of different colors, those emitted light beams are prevented from being mixed, and from creating a mixed color.

Fourth Variation

Although the foregoing embodiment represents the case where the display image to be led to the left eye (first image light) and the display image to be led to the right eye (second image light) are identical, the first image light and the second image light may instead be different images. Such an arrangement allows the user of the HMD to view a three-dimensional (3D) image utilizing the parallax between the first image light and the second image light. Accordingly, the light emitting device according to the invention is also applicable to a 3D head-mounted display that displays three-dimensional images to the user.

Figure 6:
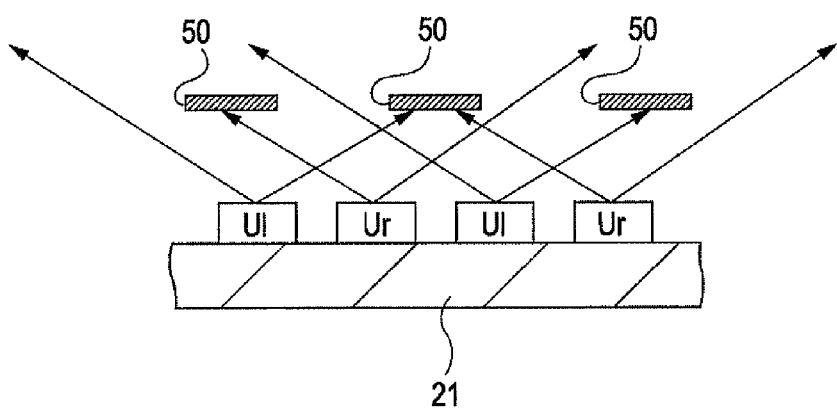
FIG. 6 is a schematic cross-sectional view of a light emitting device according to another variation of the invention.

In this variation, a plurality of light emitting elements Ul that generate the first image light and a plurality of light emitting elements Ur that generate the second image light are arranged on the substrate 21, as shown in FIG. 6. Also, slits 50 are provided so as to lead to the viewer side only the resonant light travelling obliquely to the left, out of the two resonant light beams outputted from each light emitting element Ul, and to lead to the viewer side only the resonant light travelling obliquely to the right, out of the two resonant light beams outputted from each light emitting element Ur.

As shown in FIG. 6, out of the two resonant light beams outputted from each light emitting element Ul, the resonant light travelling obliquely to the left is led to the viewer side, while the resonant light travelling obliquely to the right is inhibited by the slit 50 from travelling toward the viewer side. Then the resonant light travelling obliquely to the left and led to the viewer side reaches the left eye of the user, through the sub-lens 30L and the light guide plate 40L as described earlier. Likewise, as shown in FIG. 6, out of the two resonant light beams outputted from each light emitting element Ur, the resonant light travelling obliquely to the right is led to the viewer side, while the resonant light travelling obliquely to the left is inhibited by the slit 50 from travelling toward the viewer side. Then the resonant light travelling obliquely to the right and led to the viewer side reaches the right eye of the user, through the sub-lens 30R and the light guide plate 40R as described earlier.

Fifth Variation

In the foregoing embodiments, the transparent conductive layer 23 serves as the anode of the light emitting element U, and the semi-reflection layer 25 serves as the cathode of the light emitting element U. Alternatively, the transparent conductive layer 23 may be set to act as the cathode and the semi-reflection layer 25 as the anode.

In the foregoing embodiments, the light emitting layer 27 of each light emitting element U is composed of an organic EL material that outputs light of a wavelength range corresponding to one of red (R), green (G), and blue (B). Alternatively, each of the light emitting layers 27 may be composed of an organic EL material that outputs light of a wavelength range corresponding to white. In this case, the distances L, Lt, and Lf are to be individually determined such that a relationship among a peak wavelength $\lambda$ of a color to be outputted from each light emitting element U, the distance L and the angle $\theta$ satisfies the foregoing equation (4).

This application claims priority from Japanese which is hereby incorporated by reference in its entirely.

What is claimed is:

1. A light emitting device, comprising:
a light emitting element that includes:
a reflection layer formed above a substrate,
a light emitting layer formed above the reflection layer, and
a semi-reflection layer formed above the light emitting, layer, so as to transmit a portion of light from the light emitting layer and to reflect a remaining portion of the light,
wherein the light emitting element is configured as an optical resonator that causes a portion of the light outputted by the light emitting layer travelling at a predetermined angle $\theta$, larger than 0 degrees with respect to a direction perpendicular to the reflection layer, to resonate between the reflection layer and the semi-reflection layer and extracts the light from the side of the semi-reflection layer.

2. The light emitting device according to claim 1,
wherein an optical distance L between the reflection layer and the semi-reflection layer is determined in accordance with the following equation, in which $\lambda$ represents a wavelength of the light emitted from the light emitting layer:

$$2L/\cos\theta = m \times \lambda \text{ (}m\text{ is a natural number)}.$$

3. The light emitting device according to claim 1,
wherein the angle $\theta$ is set such that the light travelling toward the semi-reflection layer at the angle $\theta$ can be prevented from being totally reflected by the semi-reflection layer.

4. The light emitting device according to claim 1,
wherein a plurality of light emitting elements that respectively emit different colors constitute a group, and a plurality of such groups are arranged on the substrate;
the light emitting device further comprising:
a plurality of color filters each disposed so as to correspond to each of the plurality of light emitting elements on a one-to-one basis, and to receive the resonant light from the corresponding light emitting element.

5. The light emitting device according to claim 1, further comprising:
a transparent conductive layer provided between the light emitting layer and the reflection layer so as to serve as an electrode of the light emitting element;
wherein the semi-reflection layer serves as the other electrode of the light emitting element.

6. The light emitting device according to claim 1, further comprising:
a transparent conductive layer provided between the light emitting layer and the reflection layer so as to serve as an electrode of the light emitting element; and
a light-transmissive insulation layer provided between the transparent conductive layer and the reflection layer;
wherein the semi-reflection layer serves as the other electrode of the light emitting element.

7. An electronic device comprising the light emitting device according to claim 1.

8. An electronic device comprising the light emitting device according to claim 2.

9. An electronic device comprising the light emitting device according to claim 3.

10. An electronic device comprising the light emitting device according to claim 4.

11. An electronic device comprising the light emitting device according to claim 5.

12. An electronic device comprising the light emitting device according to claim 6.

* * * * *